United States Patent [19]
Chollet et al.

[11] Patent Number: 5,078,823
[45] Date of Patent: Jan. 7, 1992

[54] PLASMA REACTOR

[75] Inventors: M. Patrick Chollet; M. Serge Saada, both of Lannion, France

[73] Assignee: Defitech S.A., Tregastral, France

[21] Appl. No.: 525,406

[22] Filed: May 18, 1990

[30] Foreign Application Priority Data

May 18, 1989 [FR] France ................. 89 06508

[51] Int. Cl.$^5$ .................. C23F 1/02; B05B 5/025
[52] U.S. Cl. .................. 156/345; 204/298.38; 118/623
[58] Field of Search .............. 204/298.31, 298.38, 204/192.32; 156/345; 118/623, 50.1

[56] References Cited

U.S. PATENT DOCUMENTS

| | | | |
|---|---|---|---|
| 4,430,138 | 2/1984 | Suzuki et al. | 204/298.38 X |
| 4,462,863 | 7/1984 | Nishimatsu et al. | 204/298.38 X |
| 4,563,240 | 1/1986 | Shibata et al. | 204/298.38 X |
| 4,611,121 | 9/1986 | Miyamura et al. | 204/298.38 X |
| 4,831,963 | 5/1989 | Saito et al. | 204/298.38 X |
| 4,876,983 | 10/1989 | Fukuda et al. | 204/298.38 X |
| 4,877,509 | 10/1989 | Ogawa et al. | 156/345 X |
| 4,952,273 | 8/1990 | Popov | 204/298.38 X |

Primary Examiner—Nam X. Nguyen
Attorney, Agent, or Firm—Locke Reynolds

[57] ABSTRACT

A plasma reactor, of the type comprising an enclosure capable of receiving a gas flow, a generator of high-frequency electromagnetic waves and means for the non-resonant coupling of the generator with the enclosure, the coupling means including at least one horn with widening having an essentially rectangular cross-section, with its two walls perpendicular to the direction of the electrical field moving away angularly from each other, the two walls parallel to the direction of the electrical field remaining substantially parallel. Preferably, the reactor includes a horn with widening and a horn with narrowing parallel to the direction of the electrical field, placed essentially in succession in coupling means. The invention thus makes it possible to obtain large-sized plasmas of any shapes with high homogeneity.

27 Claims, 8 Drawing Sheets

PLASMA REACTOR

BACKGROUND OF THE INVENTION

1. Field of the Invention

The field of the invention is that of plasma reactors.

The invention can be applied notably to the surface treatment of samples, for example the etching of a layer of silicon oxide deposited on a micro-electronic substrate. More generally, the plasma reactor of the invention concerns the treatment of objects of any type including, possibly, fragile materials such as polymers, irrespectively of their size and number. It can be used, in particular, to obtain large-sized plasmas.

2. Description of the Prior Art

There already exist known plasma reactors enabling a surface treatment of samples. Such reactors may notably include an enclosure capable of receiving a chosen gas flow, and a generator of high-frequency electromagnetic waves. The plasma is obtained by placing the gas flow in the presence of the electromagnetic waves.

The reactor therefore also includes means for coupling the enclosure with the electromagnetic wave generator. To be efficient, this coupling should be non-resonant with the enclosure. In other words, the enclosure should not dissipate, in the form of electromagnetic radiation, the high-frequency energy communicated to it in the presence of gas.

In one particular approach to providing for a non-resonant coupling with a large-sized enclosure, the end part of the coupling means comprises a horn that is gradually thinned in one direction and widened in the other direction until a flat rectangular cross-section completely surrounding said enclosure is achieved.

To provide notably for a uniform distribution of the electromagnetic energy around the chamber, in order to contribute to a satisfactory homogeneity of the plasma, the horns used inside these coupling means should provide high gain while, at the same time, minimizing the modification of the phase of the electrical field between the input and the output of the horn.

Now, the phase modifying factor depends, as a rough estimate, on a function of the square of the aperture of the horn. This has earned it the designation, commonly used by those skilled in the art, of "phase r.m.s. error".

It would therefore appear to be necessary to restrict the angle of aperture of the horn as much as possible. This then also makes it possible to consider the components of the higher modes of the electrical field as being negligible as compared with those of the dominant mode.

As a consequence, obtaining a high gain then dictates the increasing of the length of the horn.

However, the space taken up by such reactors, which is directly related to the length of the horns, proves to be a penalizing factor in certain applications which require, notably, the use of plasma reactors of large sizes or of any shapes.

For, as a rule, the plasma reactors are placed in clean room environments, the cost of which is very high and essentially related to the volume of the rooms. It would therefore appear to be very important to reduce the space occupied by such reactors.

To make the plasma homogeneous, in order to obtain more efficient surface treatment of samples for example, provision may also be made to apply a magnetic field of diffusion in the enclosure.

The application of such a magnetic field has the drawback of using large quantity of energy, sometimes greater than that used to produce the plasma.

The result thereof is a restriction of the dimensions of the reactor and, consequently, a restriction of the dimensions of the plasma obtained. This prevents the treatment of large samples.

Besides, for certain types of processing, the plasma obtained in such reactors proves to have insufficient homogeneity.

It is an aim of the invention to mitigate these various drawbacks.

SUMMARY OF THE INVENTION

More precisely, it is an aim of the invention to provide a compact plasma reactor that enables, notably, the treatment of large-sized samples while, at the same time, restricting the necessary volume of the clean room.

It is another aim of the invention to provide a plasma reactor such as this making it possible to obtain large-sized plasmas of any shape.

It is also an aim of the invention provide a plasma reactor such as this, giving a very homogeneous plasma. A particular aim, moreover, is to enable the adaptation of the homogeneity of this plasma or, in certain particular cases, the creation of a plasma having deliberately inhomogeneous zones.

Another aim of the invention is to provide a plasma reactor such as this, having a wide operating range in terms of pressure as well as power and giving a very stable plasma.

It is a particular aim of the invention to provide a reactor with coupling means that are easy to fabricate, in comparison with the prior art, notably as regards the quality of the surface conditions.

The invention is also aimed at providing a plasma reactor capable of industrial-scale application. The reactor of the invention thus has the particular aims of enabling the treatment of many samples simultaneously, the "production line" treatment of series of samples and/or the treatment of one and the same sample by a plurality of successive plasmas.

Another particular aim of the invention is to provide a reactor such as this making it possible to obtain, at high etching speeds, micro-electronic circuits with etching of high homogeneity.

These aims, as well as others which shall appear subsequently, are achieved by means of a plasma reactor, of the type comprising an enclosure capable of receiving a gas flow, a generator of high-frequency electromagnetic waves and means for the non-resonant coupling of said generator with said enclosure, said means including at least one horn with widening having an essentially rectangular cross-section, with its two walls parallel to the direction of the electrical field moving away angularly from each other, the two walls perpendicular to the direction of the electrical field remaining substantially parallel.

In one advantageous embodiment, said coupling means also include at least one horn with narrowing having an essentially rectangular cross-section, with its two walls perdendicular to the direction of the electrical field approaching each other angularly, the two walls parallel to the direction of the electrical field remaining substantially parallel, and said horns being placed essentially in succession in said coupling means.

However it is quite possible, according to the invention, for the coupling means to include only one horn with widening.

Should the coupling means include two horns, said horn with widening is indifferently upline or downline of said horn with narrowing.

According to a very advantageous characteristic of the invention, on at least a part of at least one of said horns, said coupling means include obstacles to the propagation of the electromagnetic wave, placed so as to correct the phase root-mean-square error of the electrical field.

This characteristic makes it possible to reduce the length of the coupling means very appreciably, up to a factor of 10.

Advantageously, said obstacles have internal contours of symmetrically defined patterns on at least at part of the two non-parallel walls of at least one of said horns.

In a preferred embodiment of the invention, said patterns are defined by a cylindrical surface, the generatrix of which extends longitudinally on said walls.

Advantageously, said patterns substantially form a quarter-wave short-circuit for the electromagnetic wave propagated.

Said patterns may include, for example, two U-shaped profiles, the U-shaped aperture being pointed towards the interior of the horn.

In another advantageous embodiment, said patterns are defined by a cylindrical surface, the generatrix of which extends transversally on said walls describing, for example, a succession of ribs having substantially constant thickness and being evenly spaced out longitudinally on said walls.

Preferably, said obstacles extend at least in said upline horn with widening. However, it is quite possible to contemplate the positioning of such obstacles in a plurality of horns, and notably in horns with narrowing.

Advantageously, said obstacles to the propagation of the electromagnetic waves comprise specific obstacles designed to locally model the homogeneity of the electromagnetic field produced.

In a particular embodiment of the invention, said U-shaped profiles are positioned on the lateral walls of said upline horn with widening and, the aperture of the horn being equal to about 120°, the depth of the U is equal to about a quarter of the value of the wavelength propagated while the aperture of the U is equal to about a tenth of the value of the propagated wavelength.

Advantageously, the coupling means of the invention may include means capable of eliminating at least one pre-determined mode of the propagated wave.

These mode eliminating means may include, for example:
  plates located along the direction of propagation, in a part of the horn with widening, between the lower and upper walls of said horn, and distributed according to a spacing that depends on the mode or modes to be eliminated;
  a dielectric plate at the outlet of the horn;
  a dielectric material filling said horn.

Advantageously, said horn with widening includes matching means such as adjustable "penetrative" screws (namely screws that go through and project on the other side) located on at least one of the lower or upper walls of the horn.

In a preferred embodiment of the invention, there is provision for at least one plunger-type short-circuit element, completely surrounded by said end part of said coupling means and positioned opposite said horn or horns with respect to the enclosure, said plunger being adjusted to define a desired high-frequency field in the enclosure.

Advantageously, so as to reduce the volume of the plasma, said enclosure with a generally cylindrical shape generated by revolution includes a first internal tubular unit placed under vacuum, concentric with said enclosure, the wall of said first tubular unit being formed by a material having low dielectric losses. There may be provision, inside said enclosure, for a short-circuit coupled to said first tubular unit and having two ring-shaped plates surrounding this tubular unit, said ring-shaped plates being spaced out from each other by a distance that is pre-defined and adjustable in order to confine the plasma in the portion of this tubular unit included between said ring-shaped plates.

Furthermore, it is possible for this first tubular unit to house a second tubular unit internally and concentrically, the confinement of the plasma taking place in the space between the lateral walls of the two tubular units, a first sample-holder being provided inside the first tubular unit, in the vicinity of a first end of this tubular unit.

Preferably, in this case, the reactor includes means for the inlet of the gas flow that are placed in the vicinity of a second end of said first tubular unit, opposite the first one, and pumping means located opposite said means for inlet of the gas flow.

Advantageously, there may be provision for a second sample-holder placed inside said first tubular unit, in the vicinity of a second end of this first unit, opposite it, the reactor including means for the inlet of the gas flow, opening substantially into the middle of the plasma confinement zone, and pumping means located in the vicinity of the first and second ends of said first tubular unit.

Preferably, the sample-holder(s) is (or are) rotationally movable on an axis parallel to the axis of the first tubular unit.

Said second tubular unit may be notably put under vacuum, or it may contain a substance that absorbs little electromagnetically and is not plasmagenic.

Advantageously, it is provided with additional means for the confinement of the plasma, such as magnetic elements.

In another embodiment of the invention, said invention includes at least one internal unit placed under vacuum, possesing two walls that define a conduit receiving, at one end, the chosen gas flow and opening, at the other end, into a sample conveyor capable of making a sample move across in translation in a direction substantially perpendicular to the direction of the gas flow.

Advantageously, the reactor includes at least two internal units in line, cooperating with single means for coupling to a common generator of electromagnetic microwaves, so as to subject a sample placed on said conveyor to at least two treatments per plasma in a single run.

According to particular embodiments, the reactor includes at least one sample-holder comprising at least one of the following means:
  means for heating said sample-holder;
  means for cooling said sample-holder;
  means for biasing said sample-holder, In another embodiment, said coupling means include at least one essentially rectangular cross-sectioned horn, with its two walls perpendicular to the direction of the electrical field moving away angularly from each other and its two walls parallel to the direction of the electrical field approaching each other angularly, and with at least two opposite walls having, on at least a part of said horn, obstacles to the propagation of the electromagnetic wave, placed so as to correct the phase errors of the electrical field and/or the distribution of the electromagnetic field.

BRIEF DESCRIPTION OF THE DRAWINGS

Other characteristics and advantages of the invention will appear from the following detailed description and from the appended drawings, wherein.

The drawings essentially comprise elements of a definite character. On this basis, they form an integral part of the description and may not only serve to provide a clearer understanding of the following detailed description but also to contribute, if necessary, to the definition of the invention.

DESCRIPTION OF PREFERRED EMBODIMENTS

Figure 1:
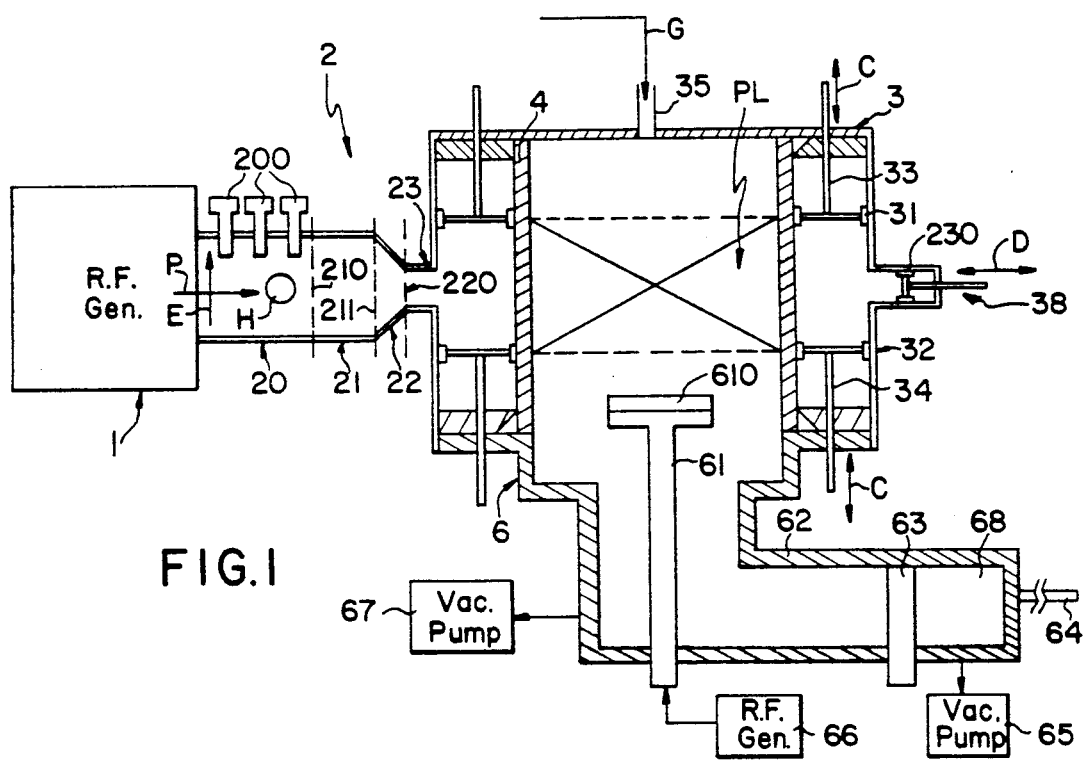
FIG. 1 is a schematic longitudinal section of an embodiment of a reactor according to the invention.
Figure 2:
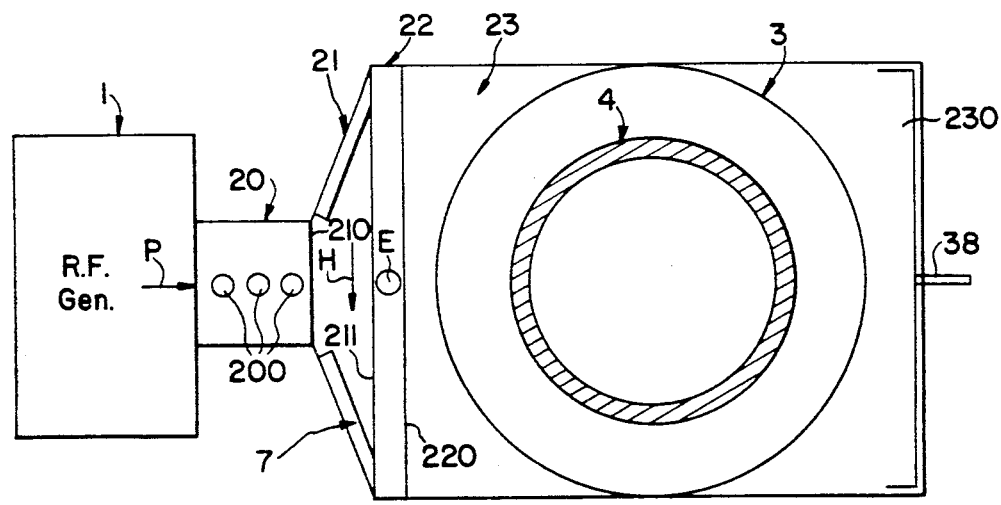
FIG. 2 is a schematic top view corresponding to the section of FIG. 1.

In the embodiment shown in FIGS. 1 and 2, the plasma reactor includes a metallic enclosure 3, made of brass for example, having a casing with a generally cylindrical shape generated by revolution.

The enclosure 3 internally and concentrically houses a tubular unit 4, the wall of which is formed by a material with low dielectric losses such as quartz.

The upper part of the enclosure 3 is provided with a circular aperture, pierced at its center with a hole enabling the passing through of a tube 35, one end of which opens into the internal tubular unit 4.

This tube 35 may be attached, by standard means, to bottles (not shown here for reasons of simplification) containing gases such as argon, oxygen and helium.

Monitoring means (also not shown) such as flow meters are used to monitor the flow-rate of the gas flow in the tube 35 as well as to obtain a chosen gas mixture in the enclosure.

In its lower part, the tubular unit 4 opens into a metal support 6, made of aluminium for example, on which the enclosure 3 rests. This support 6 has a generally rectangular case 62 possessing, on one of its lateral faces, a lock chamber 68 coupled to a gate-type valve 63 to enable a sample 610 to be introduced into the tube 4 where the plasma PL occurs.

This sample, designed to be treated by the plasma, is conveyed from the exterior of the box 62 towards a sample-holder 61 by means of a transfer rod 64. This sample-holder 61 is placed concentrically with respect to the tube 4 and is movable in vertical translation.

There is provision for primary pumping means 65 setting up a rough vacuum in the tube 4 and in the box 62, as well as secondary pumping means 67 setting up a higher vacuum in these very same units. These secondary pumping means are, for example, ROOTS type pumps having a flow-rate of the order of 2.50 m$^3$/hour.

The plasma reactor also includes a generator 1 of high-frequency electromagnetic waves capable, for example, of operating at a frequency of the order of 2.45 gigahertz and at a power value of 1.2 kilowatts.

Coupling means 2 convey the electromagnetic waves to the enclosure 3 by a non-resonant coupling with this enclosure, i.e. such that the enclosure 3 does not thermally dissipate the high-frequency electromagnetic energy.

Means are provided in the initial part for coupling a two-directional coupler (not shown here). This coupler is followed by a rectangular-sectioned intermediate part 20 in which the electromagnetic energy gets propagated in the longitudinal direction (arrow P). The electrical field E is oriented therein transversally in the plane of the figure while the magnetic field H is oriented transversally to the direction P and orthogonally to the electrical field E. The standard notation of the dot contained in a circle means that the field H is orthogonal to the plane of the figure and is directed towards a person viewing this figure.

A plurality of adjusting penetrative screws 200 (for example three in number) are provided for on this intermediate part 20 and enable the "impedance" of the reactor to be adapted in order to obtain high efficiency of the microwave transmission towards the enclosure 3.

The coupling means 2 extend towards the enclosure 3 by a length having a cross-section that changes continually from an upline section 210 to a rectangular downline section 220. This latter section is widened with respect to the upline section, parallel to the magnetic field, and is narrowed parallel to the electrical field. The geometry of this length makes it possible to define an upline horn part 21 followed by a downline horn part 22.

It must be noted here that the narrowed downline section 220 enables the directivity of the incident electromagnetic wave to be increased.

In the preferred embodiment described, the passage from the upline section 210 to the downline section 220 occurs successively by:

an upline horn part with widening 21 possessing two upline lateral walls gradually moving away from each other from the upline section onwards, and two upline lower and upper walls parallel to the direction of the magnetic field, and by a downline horn part with narrowing 22 having two downline lateral walls parallel to the direction of the lateral field and two downline lower and upper walls gradually approaching each other up to the downline section.

More generally, the coupling means according to the invention may include several horns with lateral walls moving away from each another and/or several horns with lower and upper walls approaching each other.

According to an essential characteristic of the invention, the two opposite and non-parallel walls of the upline horn part 21 have internal contours of patterns 7, symmetrical with one another and capable of acting on the phase root-mean-square error of the electrical field. For, the Applicants have observed that, surprisingly, the addition of these particular patterns contribute to providing a solution to the problem faced. It proves to be the case that their geometrical characteristics can be adjusted, as shall be explained in detail here below.

These patterns may extend throughout the length of the horn or on only a part of it. They may also occur on one more horns with widening or narrowing.

The downline horn part 22 is connected, at the level of the downline section 220, to a flat end part 23 of the coupling means, having a rectangular cross-section and completely surrounding the enclosure 3 along a non-resonant coupling with this enclosure.

The enclosure 3, in its intermediate part, is subdivided into two half-enclosures 31 and 32, separated from each other by a gap having a cross-section, for example a rectangular one, smaller than that of the flat end part 23. Thus, this difference in section enables the non-resonant coupling with the enclosure 3 and the flat end part 23 completely surrounds this enclosure at the separation of the two half-enclosures so as to bring the electromagnetic waves to the tube 4.

Inside the portion 230 of the flat end part 23, located opposite the inlet of the electromagnetic waves, there is provision for a plunger-type short-circuit element 38. This short-circuit element has a flat rectangular cross-section substantially equal to that of the portion 230.

The position of the plunger 38 is adjusted to define a desired high-frequency electrical field in the enclosure. It will be noted that the short-circuit 38 has the same electromagnetic wave distribution characteristics as the end part of the downline horn part. This makes it possible to provide for symmetry in the propagation of the waves.

The setting of the position of the plunger makes it possible to obtain couplings with an efficiency of more than 90%. As for the intermediate part 20 of the coupling means provided with its matching screws 200, it makes it possible to perfect the coupling to more than 95%.

In the context of industrial-scale application, the position of the plunger 38 is fixed while, in the case of an experimental application, the piston 38 is movable.

Inside the enclosure 3, there is provision for a second high-frequency short-circuit element coupled to the internal tubular unit 4. This short-circuit element includes two ring-shaped plates 33 and 34, also of the plunger type.

The role of these ring-shaped plates is to provide variable confinement of the plasma PL which arises in the tube 4, owing to their possibility of vertical translation along the arrow C.

In the context of an industrial-scale application, the plungers 33 and 34 are fixed while, in the context of an experimental application, they are movable.

Once the plasma PL is confined, the possibility of vertical translation of the sample-holder 61 enables the sample 610 to be carried out of or into the plasma PL. In the case of treatment of surfaces of samples comprising fragile materials such as polymers, it is preferable for the sample to be carried outside the plasma, in its vicinity.

For particular treatments of surfaces, notably for the etching of a layer of silicon oxide deposited on a substrate in microelectronics, it is established fact that a plasma of electromagnetic waves alone does not enable a fast etching of said silicon oxide to be obtained.

In this case, the plasma reactor according to the invention further includes generator means 66 capable of superimposing a radiofrequency electromagnetic field between the gas flow inlet means 35 and the sample-holder 61 in order to increase the etching speed.

The generator means 66 deliver, for example, an AC voltage at a frequency of the order of 13 megahertz. This AC voltage is applied, for example, to the sample-holder 61 while the enclosure is grounded.

It is then possible to obtain etching speeds of the order of some thousands of angstroms/minute with etching of good homogencity. This result can be explained by the fact that the plasma is very rich in positive ions. For, these positive ions bombard the sample 610 biased negatively in the presence of the electromagnetic field generated by the application of the AC voltage on the sample-holder 61.

Sometimes, there are also grounds for heating or cooling the sample by appropriate means (not shown here).

Figure 3:
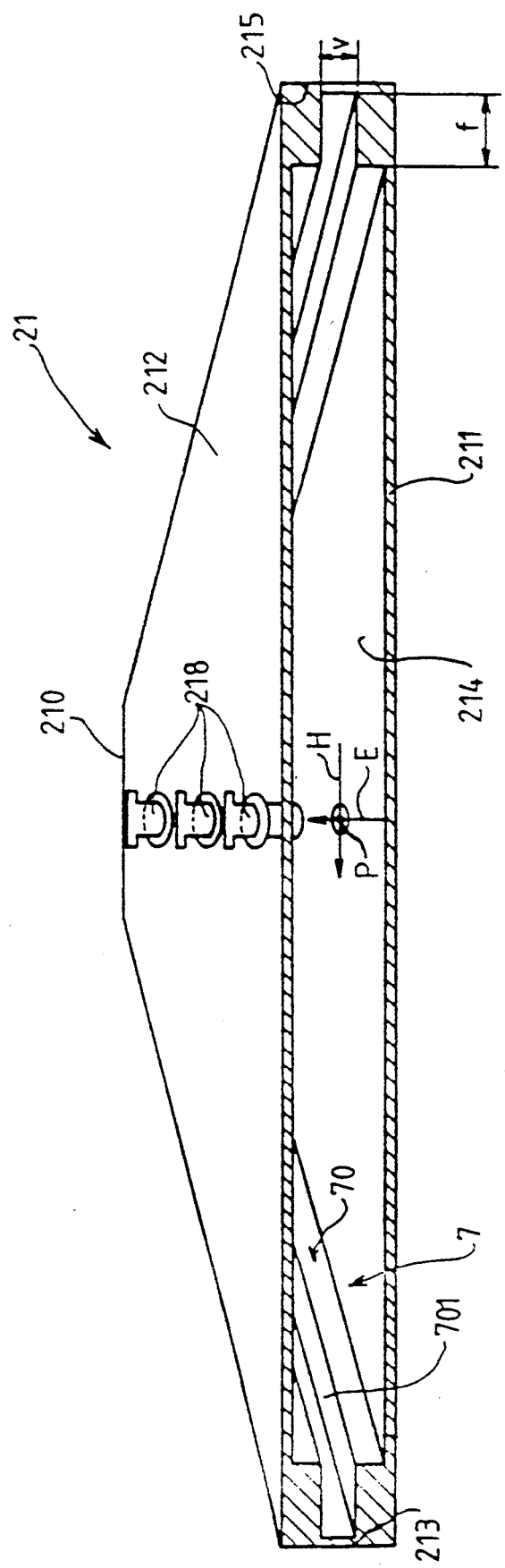
FIG. 3 is a schematic cross-section of an upline horn part of the reactor of FIG. 1.

We shall now refer more particularly to FIG. 3 to give a detailed description of the patterns 7 located inside the upline horn part 21.

The patterns 7 constitute obstacles to the propagation of the electromagnetic wave and enable the correction, firstly, of the phase errors of the electrical field by locally modifying the Maxwell equations of propagation and, secondly, of the distribution of the electromagnetic field. This correction relies on the Huygens principles of diffraction of electromagnetic waves.

Generally, in this embodiment, the patterns are defined by a cylindrical surface, the generatrix of which extends longitudinally on the lateral walls 213 and 215 of the horn part 21. It is recalled here that the term cylindrical should be understood in its general meaning of a surface generated by a straight line or generatrix shifting parallel to itself on a curve or directrix.

Generally, such patterns substantially form a quarter-wave short-circuit for the propagated wave.

Herein, they include two U-shaped profiles 70, the aperture 701 of which is pointed towards the interior of the horn. The depth f of the U is approximately equal to a quarter of the value of the propagated wavelength while the aperture v of the U is approximately equal to a tenth of the value of the propagated wavelength.

In the present case, for a propagated wavelength of 12 cm, the depth f is approximately equal to 1.2 cm. Hence, the addition of these patterns to the lateral walls enables the passage from an upline section with a dimension of 8.6 cm×4.3 cm to a widened section 211 with dimensions of 60 cm×4.3 cm, this being achieved on a length of 15 cm with a horn aperture of about 120°.

As an indication, the length of a horn not provided with these patterns 7 would be about ten times greater.

It is also possible to provide one of the lower and upper walls, namely the lower wall 212 and the upper wall 214, parallel to the direction of the electrical field L, with matching means such as adjustable, penetrative screws 218 (for example three in number) evenly spaced out by a quarter of the value of the propagated wavelength.

Of course, the optimization of the directivity of the emergent wave, of the phase root-mean-square error and of the gain of the horn take account, firstly, of the working frequency and, secondly, of the desired aperture.

The succession of the two horns contributes to further increasing the efficiency of the plasma reactor according to the invention and makes it possible, in combination with the use of the patterns, to obtain an even greater homogenity of the plasma by a uniform distribution of the electromagnetic wave, since it proves to be possible to adjust the geometrical characteristics and layout characteristics of the patterns to correct the inhomogeneity defects locally.

It must be noted here that, on the contrary, this potential for acting locally on the phase root-mean-square error makes it possible, in certain applications, to create plasmas having deliberately inhomogeneous zones.

Figure 4:
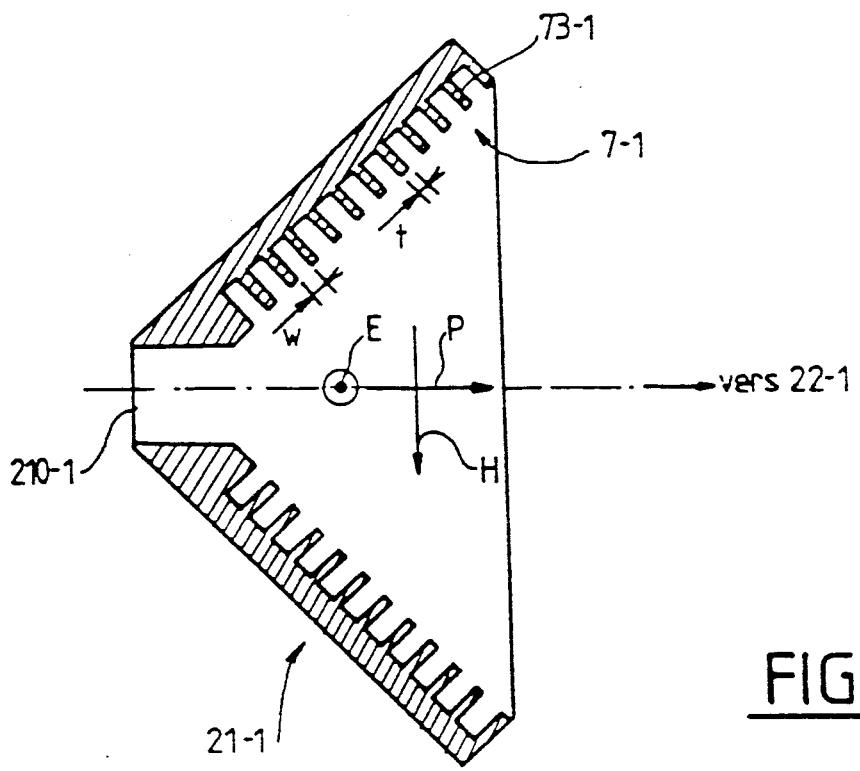
FIG. 4 is a schematic longitudinal section of a variant of an upline horn part.

Other patterns capable of acting on the phase root-mean-square error may be envisaged. An example of these patterns is described in FIG. 4 in which the elements similar to or having functions similar to those shown in FIG. 3 have the same references as the ones they had in this FIG. 3 but with the added suffix 1. Only the differences between these two figures shall be described.

The patterns 7-1 are defined here by a cylindrical surface, the generatrix of which extends transversally on the upline lateral walls of the horn part 21-1. These patterns are achieved, in the example of FIG. 4, by a succession of ribs 73-1 which have a substantially constant thickness t and are substantially spaced out from one another by a distance w in the longitudinal direction. The values w and t depend, of course, on the geometrical shapes of the horn and the propagated mode. In one particular mode, the value of w is equal to a quarter of the value of the propagated wavelength while the value t may be of the order of some tenths of the value of the wavelength propagated.

Figure 5:
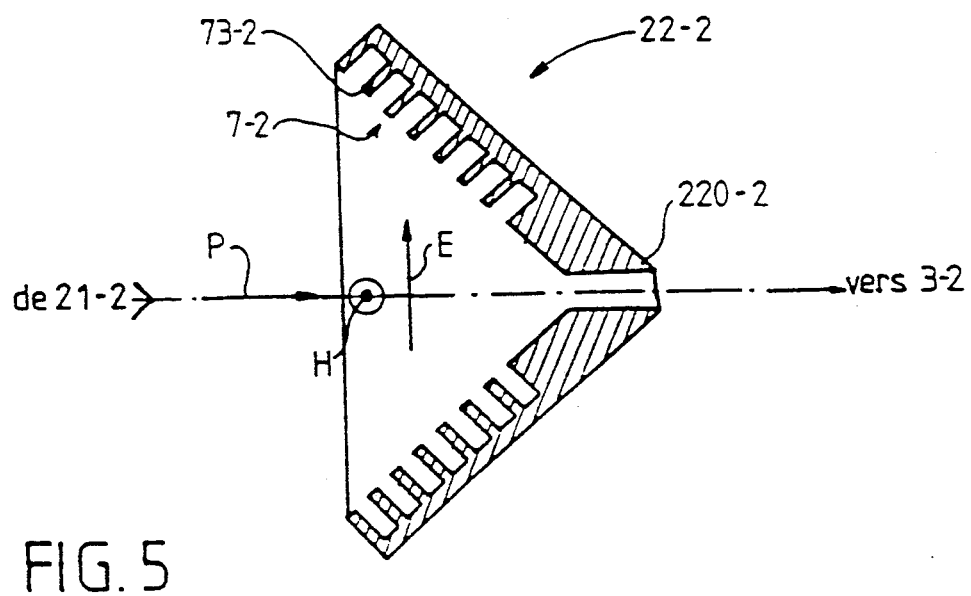
FIG. 5 is a schematic longitudinal view of a variant of a downline horn part.

Generally, the downline horn part is not provided with patterns capable of acting on the phase root-mean-square error of the electrical field, owing to its minimal space factor. However, it is possible to consider providing the lower and upper walls of the downline horn part 22-2 (FIG. 5) with symmetrical patterns 7-2 consisting, for example, of a succession of ribs 73-2 similar to those described in FIG. 4.

Figure 6:
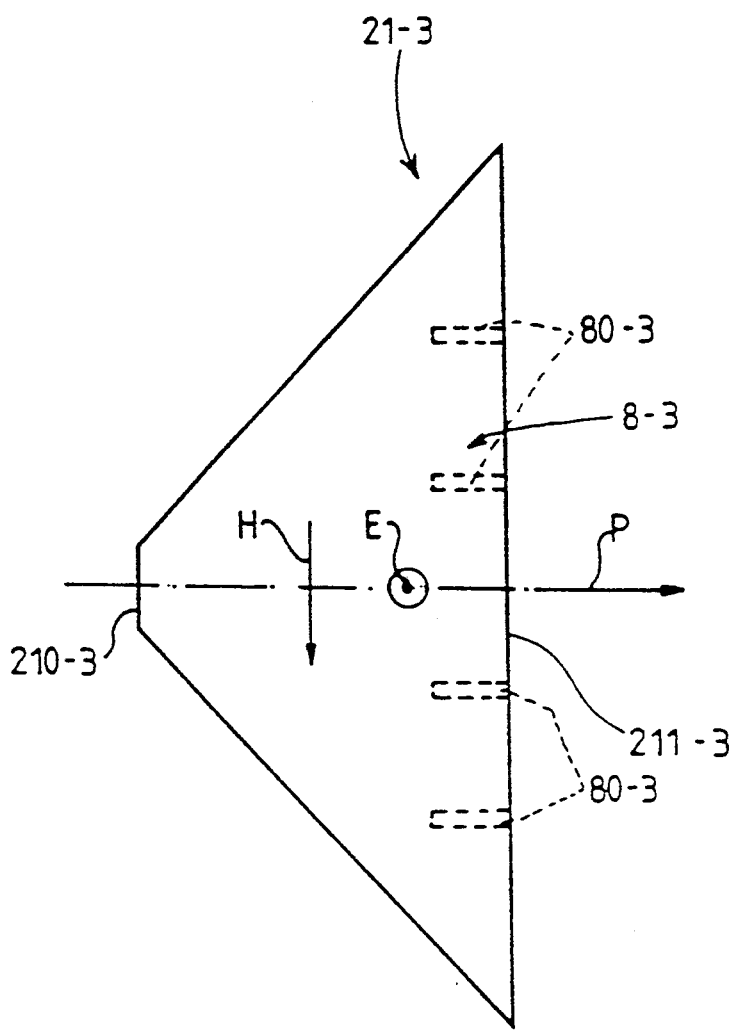
FIG. 6 is a schematic depiction of another variant of an upline horn part.

As an alternative, the upline horn part may include means capable of eliminating pre-determined modes of the propagated wave. Such a horn is illustrated schematically in FIG. 6 in which the elements similar to or having functions similar to those shown in FIG. 3 have the same references as those they had in FIG. 3 but with the added reference 3. Only the differences between these two figures shall be described.

These means 8-3, capable of eliminating the pre-determined modes, comprise plates 80-3 located, along the direction of propagation P, in a part of the upline horn part 21-3 between its lower and upper walls. These plates are distributed according to a spacing that depends on the mode to be eliminated. In other words, their positions coincide with the zones of maximum amplitude of the electrical field of the mode to be eliminated and form a short-circuit between the two plates, namely the lower plate and the upper plate, of the horn. Such a horn may also include symmetrical patterns 7 located on the non-parallel walls.

The elimination of certain modes can also be done by placing a plate made of dielectric material at the output of the horn or even by completely filling the inside of the horn with a foam or other dielectric material.

The plasma reactor is put into application as follows:
first of all, the coupling between the plunger 38 and the coupling means 2 is adjusted;
then the distance between the ring-shaped plates 33 and 34 is adjusted so as to confine the plasma to the desired zone within the tube 4.

Tests have shown that the plasma reactors according to the invention have the advantage of a wide range of operation, in terms of both pressure and power, with low and even very low standing wave ratios (SWRs), and that this is achieved with a low space factor.

Furthermore, a very stable plasma can be obtained with large relative variations in pressure and/or in power. The conditions of obtaining the plasma are easily reproducible. It is also possible to use gases such as ethylene, nitrogen or silicon chloride for the gas flows and, at the same time, preserve the same operating characteristics of the reactor.

It would seem that the high-frequency waves produced in the gas are essentially surface waves. For, it can be seen that the distribution of the electromagnetic field shows a maximum in the vicinity of the wall of the tube 4 and a minimum at the center of this tube. The plasma, which is therefore homogeneous in the portion between the ring-shaped plates 33 and 34, is then the site of high-frequency standing waves of very high intensity.

The various trials were conducted with a plasma reactor having the following dimensions;
enclosure 3: diameter about 400 mm, height 300 mm;
internal tubular unit: diameter about 195 mm, height about 300 mm;
upline section 210: 43×86 mm;
outlet section 211 of upline horn part 21: 43×600 mm;
downline section 220: 600×10 mm;
length of upline sectorial section: about 150 mm;
length of downline sectorial section: about 30 mm;
dimensions of plunger 38: about 600×10 mm.

Figure 7:
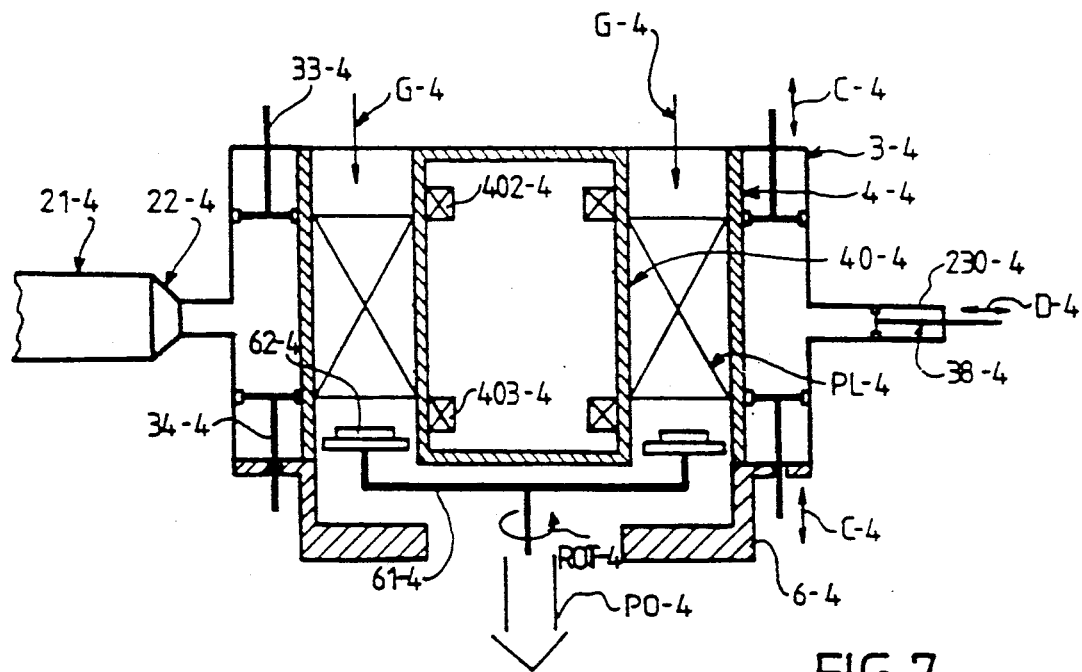
FIGS. 7 and 8 schematically illustrate another embodiment of a reactor according to the invention.
Figure 8:
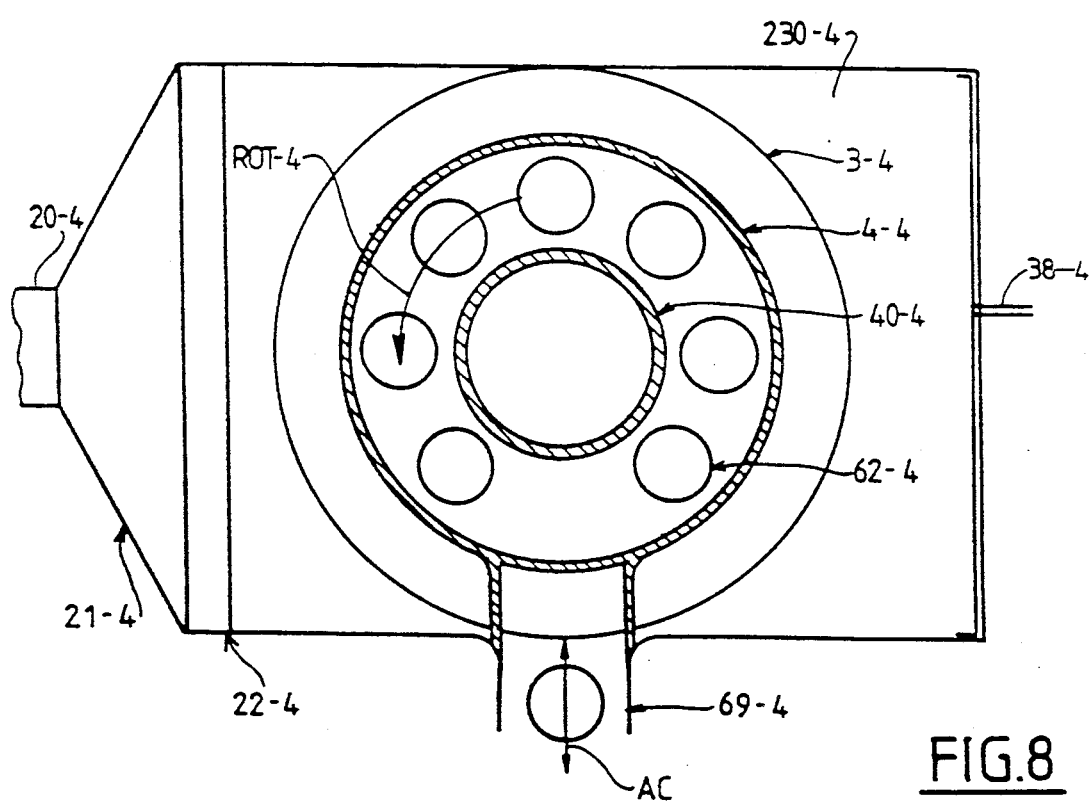

In certain applications, it may be worthwhile to carry out multiple-sample treatment operations while, at the same time, reducing the volume of plasma. An embodiment of a reactor enabling an application such as this is illustrated in FIGS. 7 and 8, wherein the elements similar to or having functions similar to those shown in FIGS. 1 and 2 have the same references as those they had in these two FIGS. 1 and 2, but with the added suffix 4. Only the differences among these four figures shall be described hereinafter.

The volume of the plasma PL-4 is reduced through the internal and concentric housing, in the tubular unit 4-4, of a second tubular unit 40-4, put under vacuum ($10^{-6}$ millibars), or containing a material that absorbs very little electromagnetically and is non-plasmagenic, for example quartz.

The plasma PL-4 is then confined in the space between the lateral walls of the two tubes 4-4 and 40-4. The effect of this, then, is to reduce the treatment time, increase the speeds of the gas flows and improvement the homogeneity of the treatment.

In order to further increase the precision of confinement of the plasma, the second internal tube 40-4 may be fitted out with additional means of confinement of the plasma such as magnetic elements 402-4 and 403-4 capable of generating a magnetic field of diffusion or else, again, plunger-type short-circuit elements similar to the plunger 33-4 and 34-4. These additional means of confinement may be located inside the tube 40-4 and/or outside it.

The sample-holder 61-4 is a ring-shaped disk that is placed in the vicinity of the lower end of the tube 4-4 and is capable of being moved rotationally on a vertical axis along the arrow ROT-4. The arrival of the gases then takes place along the arrows G-4 by the end opposite to the tube 4-4.

This sample-holder may or may not be heated and may or may not be biased by a radiofrequency electromagnetic field. The direction of pumping of the gases is shown schematically in this figure by the arrow PO-4.

The loading and unloading of the samples is done through an acess 69-4 along the arrow AC. This loading and unloading can also be done continuously.

Figure 9:
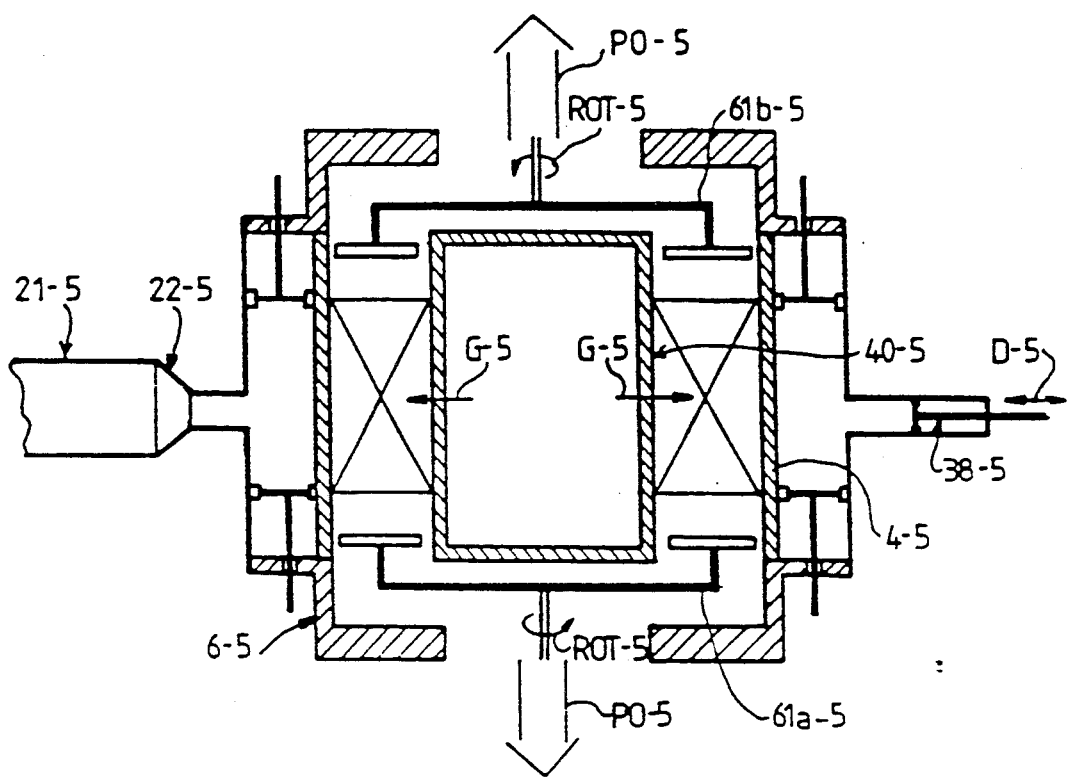
FIG. 9 illustrates yet another embodiment of the reactor according to the invention.

This embodiment can be symmetrized as shown in FIG. 9, in which the elements similar to or having functions similar to those shown in FIG. 7 have the same references as the ones they had in this FIG. 7 but with the added suffix 5. Only the differences between these two figures shall be described.

In this embodiment, the reactor has a second sample-holder 61b-5, similar to the first sample-holder 61a-5 and placed so as to face this sample-holder. The pumping is then done symmetrically by the top and the bottom of the enclosure along the arrows PO-5.

The injection of the gas flow is ensured at the middle of the tube 4-5 either by using a direct access by means of a tube (not shown herein) that plunges into the plasma or by passing through the second internal tube 40-5 along the arrows G-5. The presence of an injector such as this, placed in the center of the plasma, does not disturb it for it is located in a zone with a weak electrical field. Such a structure makes it possible notably to inrease the efficiency of the reactor without increasing its space factor.

Figure 10:
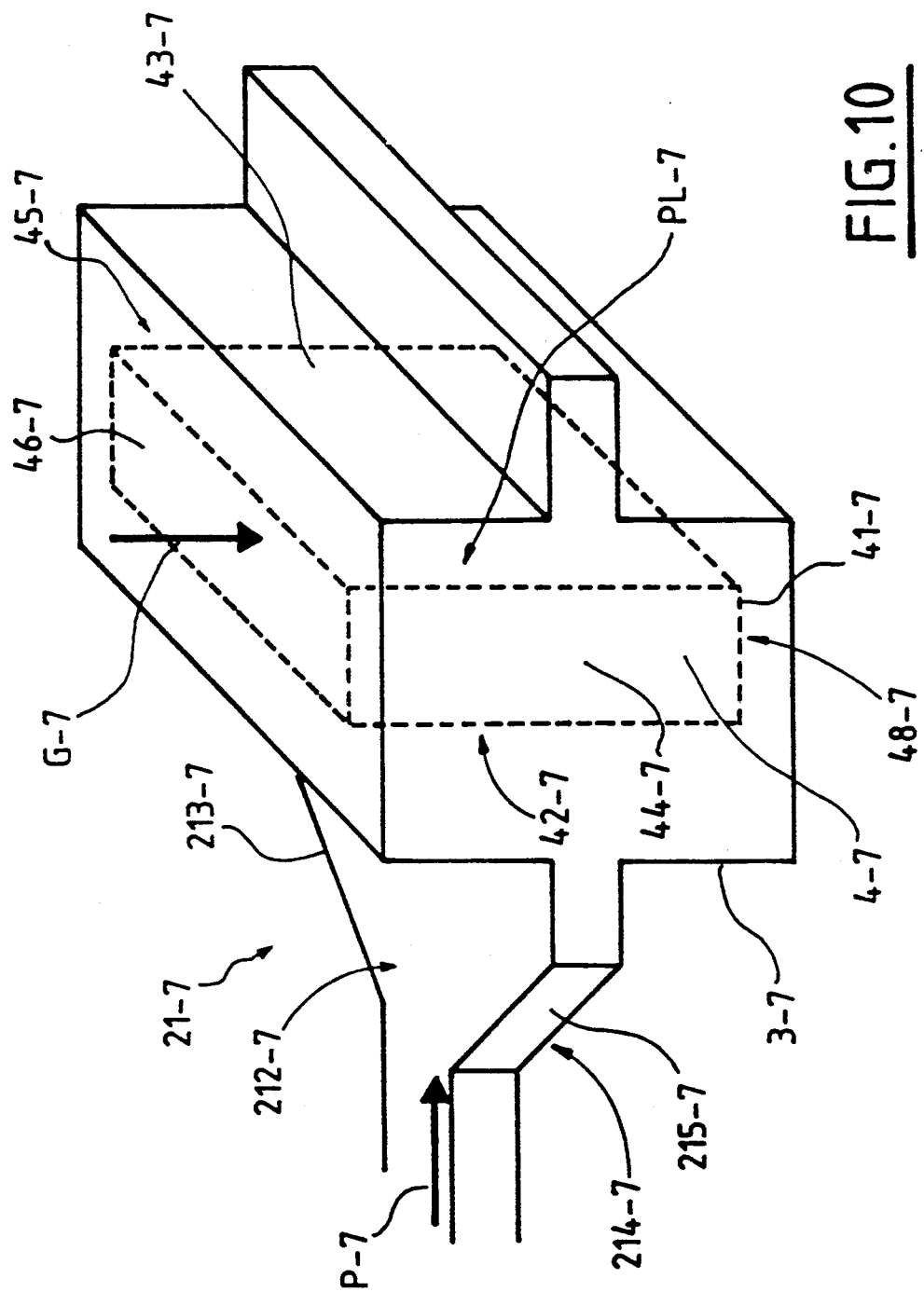
FIG. 10 presents another embodiment of a plasma reactor according to the invention.

FIG. 10 shows another embodiment of a plasma reactor according to the invention, with simplified coupling means. In this figure the elements similar to or having functions similar to those that they had in FIG. 7 have the same references as the ones they had in this FIG. 1 but with the added suffix 7.

In a surprising way, it has in fact emerged that, after enlarging the coupling means on a first piece perpendicularly to the direction of the electrical field, it is not absolutely necessary to narrow them parallel to this direction on a first length.

Thus, the coupling means may comprise only a horn 21-7, the vertical walls 213-7 and 215-7 of which move away angularly from each other until the width of the enclosure 3-7 is reached, while the horizontal walls 212-7 and 214-7 remain parallel.

This horn 21-7 may, of course, advantageously include patterns countering the propagation of the waves as described above, matching means and means for the elimination of pre-determined modes.

In the embodiment presented, the enclosure 3-7, which is large-sized, has a generally parallelepiped shape. This enclosure houses an internal unit 4-7, placed under vacuum, in which the plasma is created.

The internal unit 4-7, which is also parallelepiped-shaped, includes a stiffening armature 41-7 on which the plates defining its volume are supported. The two walls 42-7 and 43-7, which are perpendicular to the direction of propagation P-7 of the electromagnetic waves, are made of a material with low dielectric losses, such as quartz. The vertical plates 44-7, 45-7 and horizontal plates 46-7, 47-7 parallel to the direction of propagation P-7, are metallic.

The gas flow G-7 is introduced by the upper part of the enclosure 3-7 into the unit 4-7. The plasma PL-7 is obtained in the internal unit 4-7 in a volume that may be variable, as a function of adjustable short-circuits (not shown) placed in the enclosure 3-7.

The samples to be treated may be introduced into the internal unit 4-7 by means of a movable support. They may also be placed beneath the internal unit 4-7, for example on a conveyor of samples, with the gas flows 6-7 coming up to this conveyor.

Figure 11:
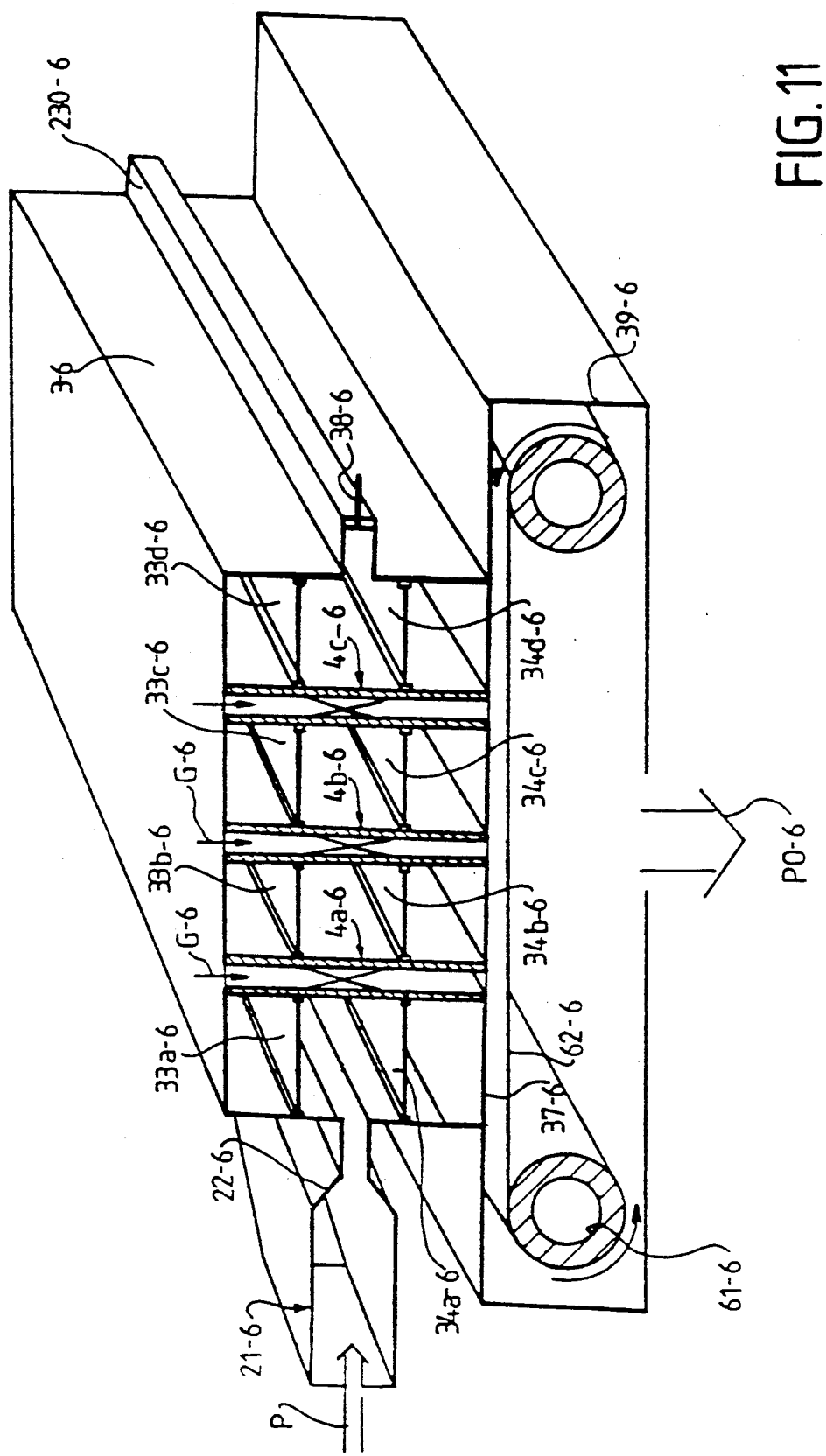
FIG. 11 also illustrates another embodiment of the reactor according to the invention.

In certain applications, notably surface coating operations, it is in fact useful to deposit the plasma in line on the sample. One embodiment enabling such an application is also shown in FIG. 11, in which the elements similar to or having functions similar to those shown in FIG. 1 have the same references as the ones they had in this FIG. 1 but with the added suffix 6. Only the differences between these two figures shall be described.

The enclosure 3-6 is large-sized with a generally prismatic shape and has, for example, a length, counted parallel to the direction of propagation, of the order of 200 mm, a width of the order of 1200 mm and a height of the order of some tens of centimeters. It has at least one internal unit placed under vacuum 4a-6, in which the plasma will be created. FIG. 10 here illustrates three identical internal units placed under vacuum, 4a-6, 4b-6, 4c-6 needed in the case of a multiple-treatment (several successive plasma deposits) in a single run.

Each of these internal units has two substantially parallel rectangular walls defining a conduit that receives, at one end, the chosen gas flow along the direction of the arrow G-6 and opens, at the other end (bottom part), into a sample conveyor 61-6, located in the bottom part 39-6 of the enclosure. These conveyor is capable of making a sample such as a sheet of glass or polymer move across in translation, in a direction substantially perpendicular to the direction of the gas flow. There is provision for an impervious seal 37-6 between the three internal units in order to insulate the end part 39-6 under vacuum from the rest of the enclosure.

Here the internal short-circuits located in the enclosure are rectangular plates 33a-6 to 33d-6 and 34a-6 to 34d-6. The pumping direction is also shown schematically herein by the arrow PO-6.

Since the volume of plasma is reduced to the maximum extent (for example, 10 mm × 1000 mm × 10 mm), the high-frequency power values needed remain relatively low (some hundreds of watts). The speeds of gas flows and, consequently, the speeds of deposition per unit of surface may thus be very high.

The invention is not restricted to the above-described embodiments but covers all their variants and, notably, the following ones:

although the patterns capable of acting on the phase root-mean-square error are preferably located in the upline horn part, it is also possible that, in a second part at least of the length, for example the downline horn part, two non-parallel opposite walls of this horn have internal contours possessing second patterns symmetrical with each other and capable of acting also on the phase root-mean-square error of the electrical field. The two parts of the length containing the first and second patterns are then preferably disjointed. And, of the first patterns and the second patterns, one set may comprise the patterns extending longitudinally while the other comprises those extending transversally on the walls;

although it is advantageous to use a length respectively comprising an upline horn part and a downline horn part, it is not impossible to provide for a length, the cross-section of which is gradually enlarged parallel to the magnetic field and narrowed parallel to the electrical field;

in each of the above described embodiments, the sample-holder may or may not be heated, cooled and biased. In the same way, the short-circuit plunger 38 may or may not be movable.

Clearly, some of the above-described means may be omitted in the variants where they are are not used.

What is claimed is:

1. A plasma reactor comprising
   an enclosure for receiving a gas flow,
   a generator of high-frequency electromagnetic waves consisting of electric fields and magnetic fields, said fields having directions orthogonal to each other and orthogonal to a propagation direction of said electromagnetic waves, and
   non-resonant coupling means free of any externally imposed magnetic field for the non-resonant coupling of said generator with said enclosure, said non-resonant coupling means comprising
      at least one widening horn having four walls defining an essentially rectangular cross-section, with two of said walls being fixed parallel to the direction of said electric field and angularly inclined away from each other, and another two of said walls being fixed perpendicular to the direction of said electric field and substantially parallel to each other.

2. A plasma reactor according to claim 1, wherein said non-resonant coupling means further comprises
   at least one narrowing horn having four walls defining an essentially rectangular cross-section, with two of the narrowing horn walls being fixed perpendicular to the direction of said electric field and angularly inclined toward each other, and another two of said narrowing horn walls being fixed parallel to the direction of said electric field and substantially parallel to each other, and
   wherein said widening horn and said narrowing horn are placed essentially in succession in said non-resonant coupling means.

3. A plasma reactor according to any one of the claims 1 to 2, wherein said non-resonant coupling means includes, on at least a part of an inner face of one of said horns, obstacles to the propagation of the electromagnetic wave for correcting any phase root-mean-square error in said electric field.

4. A plasma reactor according to claim 3, wherein said obstacles comprise internal contours of symmetrically defined patterns extending along at least part of the two angularly inclined walls of at least one of said horns.

5. A plasma reactor according to claim 4, wherein said patterns are defined by a cylindrical surface having a generatrix, the generatrix extending longitudinally on said angularly inclined walls.

6. A plasma reactor according to claim 4 wherein said patterns form substantially a quarter-wave short-circuit of said electromagnetic wave.

7. A plasma reactor according to claim 4 wherein said patterns comprise two U-shaped profiles, the U-shaped profiles having an aperture opening towards the coupling means interior.

8. A plasma reactor according to claim 7, wherein said U-shaped profiles are positioned on the angularly inclined walls of said widening horn, the widening horn having an aperture of about 120°, the U-shaped profiles having a depth of about a quarter wavelength of said electromagnetic waves, the U-shaped profiles having an aperture of a tenth wavelength.

9. A plasma reactor according to claim 4, wherein said patterns are defined by a cylindrical surface having a generatrix, the generatrix extending transversally on said angularly inclined walls.

10. A plasma reactor according to claim 9, wherein said patterns comprise a succession of ribs that have substantially constant thickness and are evenly spaced out longitudinally on said angularly inclined walls.

11. A plasma reactor according to any one of the claims 1 to 2 wherein said coupling means includes, on at least a part of an inner face of one of said horns, obstacles to the propagation of the electromagnetic waves comprising means for locally modeling the homogeneity of said electromagnetic field.

12. A plasma reactor according to any one of the claims 1 to 2 wherein said non-resonant coupling means comprises mode eliminating means for eliminating at least one pre-determined mode of said electromagnetic waves.

13. A plasma reactor according to claim 12 wherein said mode eliminating means comprise
   plates located along the direction of propagation, in a part of the widening horn between said substantially parallel walls of said widening horn, and distributed according to a spacing that depends on the mode or modes to be eliminated.

14. A plasma reactor according to claim 12 wherein said mode eliminating means comprises
   a dielectric plate at an outlet of the horn.

15. A plasma reactor according to claim 12 wherein said mode eliminating means comprises
   a dielectric material filling said horn.

16. A plasma reactor according to any one of the claims 1 to 2 wherein said widening horn includes matching means located on at least one of said substantially parallel walls of said widening horn.

17. A plasma reactor according to claim 16 wherein said matching means comprises adjustable penetrative screws located on at least one of said substantially parallel walls of said widening horn.

18. A plasma reactor comprising
   an enclosure having means for admitting a gas flow,
   a generator of high-frequency electromagnetic waves consisting of electric fields and magnetic fields, said fields having directions orthogonal to each other and orthogonal to a propagation direction of said electromagnetic waves,
   non-resonant coupling means free of any externally imposed magnetic field including an inlet fixed to the generator and an outlet, the non-resonant coupling means comprising at least one widening horn having four walls defining an essentially rectangular cross-section, two of said walls being fixed parallel to the direction of the electric field and angularly inclined away from each other, and another two of said walls being fixed perpendicular to the direction of the electric field and substantially parallel to each other, and
   a housing coupled to said outlet and surrounding the enclosure, wherein said enclosure comprises a generally cylindrical shape concentric about an axis of revolution and includes a first internal tubular unit placed under vacuum, concentric with said enclosure, a wall of said first tubular unit being formed by a material having low dielectric losses, and wherein the housing further comprises a second short-circuit element coupled to said first tubular unit and having two ring-shaped plates surrounding said tubular unit, said ring-shaped plates being spaced from each other by a distance that is predefined and adjustable in order to confine a plasma in an included portion of said tubular unit between said ring-shaped plates.

19. A plasma reactor according to claim 18 wherein the housing comprises at least one plunger-type short-circuit element, positioned opposite said coupling means with respect to the enclosure, said at least one plunger-type short-circuit element being adjustable to define a desired high-frequency field in the enclosure.

20. A plasma reactor according to claim 18, wherein said first tubular unit houses a second tubular unit internally and concentrically, the plasma confinement taking place in a plasma-confinement space between the two tubular units, and further comprising a first sample-holder provided inside the first tubular unit, in the vicinity of a first end of the first tubular unit.

21. A plasma reactor according to claim 20, wherein said means for admitting a gas flow comprises an inlet placed in the vicinity of a second end of said first tubular unit, opposite the first end, and pumping means located opposite said inlet of the gas flow.

22. A plasma reactor according to claim 20, further comprising
a second sample-holder placed inside said first tubular unit, in the vicinity of a second end of said first tubular unit, opposite said first sample-holder; and
wherein said means for admitting a gas flow opens substantially into the middle of the plasma confinement space; and
wherein pumping means are located in the vicinity of the first and second ends of said first tubular unit.

23. A plasma reactor according to claim 22 wherein said first and second sample-holders are rotationally movable on an axis parallel to the axis of said first tubular unit.

24. A plasma reactor according to any one of the claims 20 to 22, wherein the sample-holder(s) is (or are) rotationally movable on an axis parallel to the axis of revolution of the first tubular unit.

25. A plasma reactor according to any one of the claims 20 to 22, wherein said second tubular unit further includes means for putting the second tubular unit under a vacuum.

26. A plasma reactor comprising
an enclosure having at least one internal unit, means for placing the internal unit under a vacuum, the internal unit possessing two walls that define a conduit receiving, at a first end, a chosen gas to flow in a selected direction through the conduit, the conduit opening, at a second end, into a sample conveyor for making a sample move across in translation in a direction substantially perpendicular to the direction of the gas flow,
a generator of high-frequency electromagnetic waves consisting of electric fields and magnetic fields, said fields having directions orthogonal to each other and orthogonal to a propagation direction of said electromagnetic waves, and
non-resonant coupling means free of any externally imposed magnetic field including an inlet fixed to the generator and an outlet coupled to said enclosure the non-resonant coupling means comprising at least one widening horn having four walls defining an essentially rectangular cross-section, two of said walls being fixed parallel to the direction of the electric field and angularly inclined away from each other, and another two of said walls being fixed perpendicular to the direction of the electric field and substantially parallel to each other.

27. A plasma reactor according to claim 26, comprising at least two of said internal units positioned in line with respect to each other, and cooperating with only one non-resonant coupling means for coupling to a common generator of electromagnetic microwaves, said sample conveyor being arranged so as to move a sample placed on said conveyor to said second ends of all of said internal units.

* * * * *